US008852674B2

(12) United States Patent
Fu et al.

(10) Patent No.: US 8,852,674 B2
(45) Date of Patent: Oct. 7, 2014

(54) METHOD FOR SEGREGATING THE ALLOYING ELEMENTS AND REDUCING THE RESIDUE RESISTIVITY OF COPPER ALLOY LAYERS

(75) Inventors: Xinyu Fu, Fremont, CA (US); Jick M. Yu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 871 days.

(21) Appl. No.: 12/945,445

(22) Filed: Nov. 12, 2010

(65) Prior Publication Data

US 2012/0121799 A1 May 17, 2012

(51) Int. Cl.
| C23C 18/00 | (2006.01) |
| H01L 23/532 | (2006.01) |
| H01L 21/768 | (2006.01) |

(52) U.S. Cl.
CPC .... *H01L 23/53233* (2013.01); *H01L 21/76843* (2013.01); *H01L 21/76849* (2013.01); *H01L 21/76867* (2013.01); *H01L 21/76877* (2013.01); *H01L 21/76855* (2013.01); *H01L 23/53238* (2013.01); *H01L 21/76831* (2013.01)
USPC .................................................. 427/98.4

(58) Field of Classification Search
CPC ........... C23C 14/34; C23C 18/00; H05K 3/22
USPC ..................................................... 427/98.4
See application file for complete search history.

(56) References Cited

U.S. PATENT DOCUMENTS

| 6,040,240 A | 3/2000 | Matsubara |
| 6,172,421 B1* | 1/2001 | Besser et al. ................ 257/751 |
| 6,399,486 B1* | 6/2002 | Chen et al. .................... 438/660 |
| 6,607,982 B1 | 8/2003 | Powell et al. |
| 2004/0058205 A1 | 3/2004 | Mantese et al. |
| 2006/0228900 A1* | 10/2006 | Dip et al. ..................... 438/774 |
| 2007/0002239 A1* | 1/2007 | Koike ........................... 349/139 |
| 2007/0059919 A1 | 3/2007 | Ooka |
| 2008/0054467 A1* | 3/2008 | Ohba et al. ................... 257/751 |
| 2008/0173547 A1 | 7/2008 | Ohba |
| 2008/0265417 A1 | 10/2008 | Kawamura et al. |
| 2009/0017227 A1 | 1/2009 | Fu et al. |
| 2009/0095620 A1* | 4/2009 | Koike ....................... 204/298.13 |

(Continued)

FOREIGN PATENT DOCUMENTS

| JP | 11312680 | 11/1999 |
| JP | 2008538161 | 10/2008 |

OTHER PUBLICATIONS

Koike, J. et al., "Self-Forming Diffusion Barrier Layer in Cu-Mn Alloy Metallization", Jul. 22, 2005, 041911-041911-3.

(Continued)

*Primary Examiner* — Micheal Cleveland
*Assistant Examiner* — Sarah R Anderson
(74) *Attorney, Agent, or Firm* — Servilla Whitney LLC

(57) ABSTRACT

Methods for forming interconnect or interconnections on a substrate for use in a microelectric device are disclosed. In one or more embodiments, the method includes depositing an alloy layer comprising Cu and an alloying element, for, example, Mn, in a dielectric layer and segregating or diffusing the alloying element from the bulk Cu portion of the alloy layer. In one or more embodiments, the method includes annealing the alloy layer in an atomic hydrogen atmosphere. After annealing, the alloy layer exhibits a resistivity that is substantially equivalent to the resistivity of a pure Cu layer.

18 Claims, 6 Drawing Sheets

(56) References Cited

U.S. PATENT DOCUMENTS

| | | |
|---|---|---|
| 2009/0243112 A1 | 10/2009 | Koike |
| 2009/0321935 A1* | 12/2009 | O'Brien et al. ............ 257/751 |
| 2009/0321937 A1 | 12/2009 | Haneda |
| 2010/0009530 A1 | 1/2010 | Haneda et al. |
| 2010/0038792 A1 | 2/2010 | Ochimizu |
| 2010/0065967 A1 | 3/2010 | Koike |
| 2010/0154213 A1 | 6/2010 | Koike et al. |
| 2010/0155951 A1 | 6/2010 | Koike et al. |
| 2010/0155952 A1 | 6/2010 | Koike et al. |
| 2010/0167526 A1 | 7/2010 | Fu et al. |
| 2010/0200991 A1 | 8/2010 | Akolkar et al. |

OTHER PUBLICATIONS

"International Search Report and Written Opinion in PCT/US2011/060115", mailed on May 10, 2012, 11 pages.

\* cited by examiner

METHOD FOR SEGREGATING THE ALLOYING ELEMENTS AND REDUCING THE RESIDUE RESISTIVITY OF COPPER ALLOY LAYERS

BACKGROUND

Embodiments of the present invention pertain to interconnection processing of semiconductors. Specific embodiments pertain to interconnection processes utilizing copper alloys, such as Cu—Mn, as interconnect material and the segregation of the alloying elements from the bulk copper component.

Microelectronic devices, such as semiconductors or integrated circuits, can include millions of electronic circuit devices such as transistors, capacitors, etc. To further increase the density of devices found on integrated circuits, even smaller feature sizes are desired. To achieve these smaller feature sizes, the size of conductive lines, vias, and interconnects, gates, etc. must be reduced. Reliable formation of multilevel interconnect structures is also necessary to increase circuit density and quality. Advances in fabrication techniques have enabled use of copper for conductive lines, interconnects, vias, and other structures. However, electromigration in interconnect structures becomes a greater hurdle to overcome, with decreased feature size and the increased use of copper for interconnections.

Conventional processes for forming interconnect material or interconnections include the formation of a barrier layer on a dielectric layer, deposition of a copper layer on the barrier layer and an electroplated gapfill process. More recently developed processes have incorporated dopants or alloying elements to alloy the copper layer. Interest in the use of copper alloys, such as Cu—Mn alloys, as interconnect material has been increasing due the possibility of such alloys to build a self-forming barrier that prevents interdiffusion between Cu and Si atoms. The use of Cu—Mn alloys, however, has been found to significantly increase resistivity, especially where the Cu—Mn alloy layers have been thermally annealed in oxidizing or noble gas environments. Accordingly, there is a need to reduce the high resistivity of Cu—Mn alloy interconnect material, which could cause significant increases in line resistance, and a need to control diffusion of Mn atoms into the desired interfaces to achieve a consistent performance.

SUMMARY OF THE INVENTION

A first aspect of the present invention pertains to a method for forming interconnections in a microelectronic device. In one or more embodiments, the method includes providing a substrate comprising a dielectric layer disposed thereon and depositing an alloy layer comprising Cu and an alloying element in the dielectric layer. As used herein, the phrase "alloy layer" may include or be referred to as an alloy seed layer or alloyed seed layer. The alloy layer includes a bottom surface that is in contact with the dielectric layer, a top surface and a bulk between the bottom surface and the top surface. The alloying element utilized in one or more embodiments of the method may include one or more of Mn, Mg, Ta, Zr and combinations thereof.

One or more embodiments of the method also include annealing the substrate in hydrogen under conditions to diffuse the alloying element toward the bottom surface and the top surface. In one or more embodiments, the method may include annealing the substrate at a temperature in the range from about 200° C. to about 400° C. In one or more embodiments, the method includes annealing the substrate at a temperature of about 300° C. Annealing may be performed at these temperatures for a period of time in the range from about 0.5 minutes to about 5 minutes.

In one variant, the substrate is annealed in an atomic hydrogen environment. In embodiments that utilize an atomic hydrogen environment during annealing, the method may include generating the atomic hydrogen environment in a plasma source. In one or more embodiments, the hydrogen gas may be introduced into the reaction chamber that includes a plasma source or plasma source power applicator that may include a coil antenna disposed over the ceiling of the reaction chamber and coupled to a power source. In such embodiments, the method may include introducing the hydrogen gas in the remote plasma chamber and energizing the hydrogen gas to create an atomic hydrogen environment. Alternatively, the method may include energizing the hydrogen gas in a remote plasma chamber in fluid communication with the reaction chamber. The hydrogen gas is energized in the remote plasma chamber and then introduced into the reaction chamber to create an atomic hydrogen environment.

In one or more embodiments, the methods described herein include providing a substrate in a reaction chamber. In such embodiments, providing a substrate in a reaction chamber may include further processing the substrate in the reaction chamber. Specifically, providing a substrate in a reaction chamber may include depositing material on the substrate, etching any deposited material and other processing steps that are common to microelectronic device manufacturing.

In one or more embodiments, the method for forming interconnections in a microelectronic device results in the formation of an alloyed layer that exhibits a resistivity of substantially equivalent to a layer comprising pure Cu. As used herein, the phrase "substantially equivalent" when used in connection or with reference to resistivity includes a difference in resistivity of less than about 1 μΩ/cm. In one or more embodiments, the phrase "substantially equivalent" when used in connection or with reference to resistivity includes a difference of less than about 0.5 μΩ/cm. In one variant, after diffusing the alloying element toward the top surface and bottom surface, the alloy layer exhibits a resistivity 60% less than the resistivity exhibited by the alloy layer before diffusing the alloying element.

A second aspect of the present invention pertains to a method for forming a copper interconnection on a substrate. In one or more embodiments, the method includes disposing or providing the substrate in a reaction chamber, depositing a dielectric layer on the substrate in the reaction chamber, depositing an alloy layer comprising Cu and an Mn alloying element in the dielectric layer and annealing the substrate in an atomic hydrogen environment to segregate the Mn alloying element from the Cu. In one variant of the method, annealing occurs at a temperature in the range from about 200° C. to about 400° C., or, more specifically at about 300° C. In one or more embodiments, the substrate is annealed for a period of time in the range from about 0.5 minutes to about 5 minutes.

The alloy layer includes a bottom surface in contact with the dielectric layer, a top surface and a bulk between the bottom surface and the top surface. In one or more embodiments of the method, segregating the Mn alloying element includes diffusing the Mn alloying element toward the top surface and the bottom surface of the alloy layer. In one or more embodiments, the resulting alloy layer exhibits a resistivity of in the range from about 5 μΩ/cm to about 2 μΩ/cm or, more specifically, a resistivity of less than about 3 μΩ/cm.

A third aspect of the present invention pertains to a method for reducing electromigration of copper in microelectronic devices. In one or more embodiments, the method includes depositing a dielectric layer on a substrate, forming at least one copper interconnection structure in the dielectric layer, wherein the copper interconnection structure comprising copper and manganese, and annealing the copper interconnection structure in a hydrogen environment, which may include an atomic hydrogen environment. In one or more embodiments, the formation of the at least one copper interconnection structure includes forming a trench and a via in the dielectric layer and depositing a copper and manganese alloy layer in the trench and the via. The copper and manganese alloy layer may be deposited by copper electrochemical plating. The method may optionally include planarizing the copper and manganese alloy layer by chemical mechanical planarization prior to annealing the copper interconnection structure.

The resulting copper interconnection structure includes a top surface, a bottom surface in contact with the dielectric layer and a bulk between the top surface and the bottom surface, the top surface and the bottom surface comprising a higher concentration of Mn atoms than the bulk.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
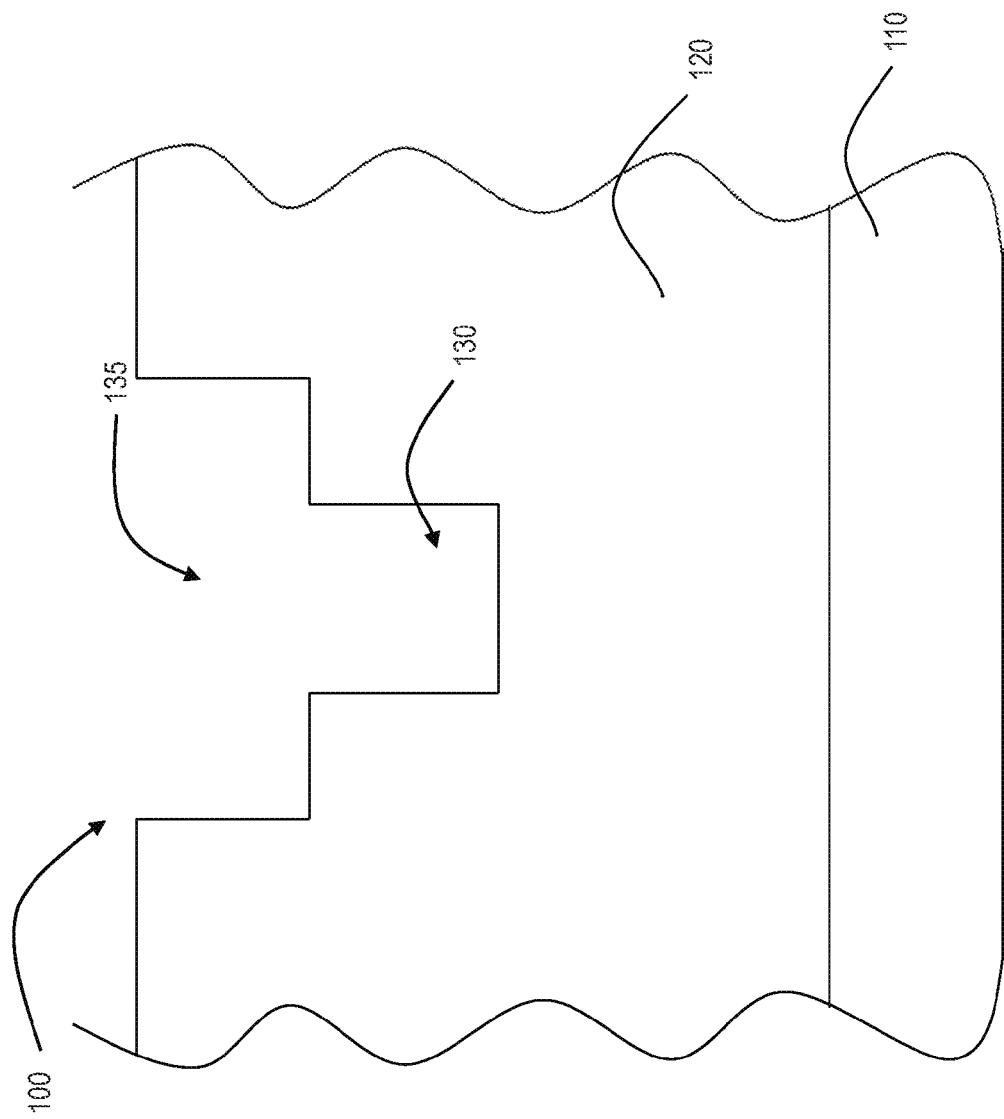
FIG. 1 illustrates a via and trench recess formed on a dielectric layer disposed on a substrate for use with one or more embodiments of the present invention.

Embodiments of the invention generally provide a method of forming interconnect material or interconnections on a substrate. One or more embodiments pertain to a method for forming interconnect material or interconnections including a Cu alloy layer that exhibits reduced resistivity and prevents electromigration of copper atoms.

The use of alloying elements such as Mn in copper layers has been shown to reduce electromigration of Cu atoms into the underlying dielectric layer and improve gapfill, while allowing smaller scaling of the interconnect material or layer. Electromigration is the transport of material caused by the gradual movement of the atoms in a conductor (e.g. Cu atoms) due to the momentum transfer between conducting electrons and diffusing metal atoms that can cause depletion or accumulation of metal atoms. During normal, regular use of microelectronic devices, electrons collide with metal atoms causing the atoms to gradually move. This movement may cause a depletion of atoms at the negative end of the conductor, leading to voids, thinning of lines, and a potential open circuit.

In other regions of the conductor, an accumulation of metal atoms may pile up and form hillocks, protrusions on the surface of metal layers due to electromigration. If excessive or large hillocks form, adjacent lines or lines on two levels may short together.

The process of electromigration changes the shape of a metal conductor under the influence of an electric current flowing through it, eventually leading to the breaking of the conductor. The electromigration effect is important in applications where high direct current densities are used. As the feature size in microelectronic devices, such integrated circuits, decreases, the practical significance of electromigration increases. Electromigration reliability is one of the most critical issues in back-end-of-line (BEOL) interconnection formation.

As will be discussed below, conventional processes to form interconnections on a substrate incorporate a barrier layer. When feature size is reduced, the thickness of the barrier layer and coverage become growing concerns with regard to line resistance and ECP gapfill performance. There is growing interest in utilizing copper alloys, such as Cu—Mn alloys, for use in copper interconnect materials or interconnection processes due to the possibility of the Cu—Mn alloy building a self-forming barrier and thus eliminating or reducing the need for a separate or additional barrier layer that is typically formed prior to deposition of the Cu—Mn alloy layer. The methods of forming an interconnect material described herein replace the conventional two-step deposition process that form a barrier layer and an alloy layer with a single alloy layer, while still reducing or preventing electromigration.

As described above, the use of Cu—Mn alloy layers has shown a significant increase in resistivity. This increase in resistivity is believed to be caused by the presence of Mn atoms in the bulk Cu portion of the Cu—Mn alloy layer. The present invention improves electrical performance of microelectric devices that incorporate interconnections formed from Cu—Mn alloy layers by reducing electromigration and resistivity. In particular, the present invention relates to an annealing process that segregates the Mn alloying element from the bulk Cu portion of a Cu—Mn alloy layer. The segregated Mn forms a self-forming barrier that prevents Cu diffusion or electromigration and minimizes the interference between the alloying element and Cu atoms.

During BEOL processing of integrated circuit fabrication, the microelectronic device undergoes various processes to form interconnections between the previously formed devices on the semiconductor substrate, such as transistors, resistors, etc. The formation of microelectronic devices such as integrated circuits may employ hundreds, if not thousands, of individual process steps, such as deposition, photolithography, etching, ion implantation, oxidation, CMP, etc. to form various features in the microelectronic device. Due to the lengthy nature of reviewing each and every process step, only some of these steps will be discussed as part of the overall manufacture of microelectronic devices.

The formation of copper interconnections typically involves fabrication of a dual Damascene structure 100 in a dielectric layer 120 that is deposited on a substrate 110. However, it will be understood that other interconnection structures (i.e., single damascene structures) may also be formed using the methods described herein. Formation of a Damascene structure 100 includes the forming a via 130 and trench 135 recess in the dielectric layer 120 on a substrate 110 using techniques, such as via and trench patterning, etching processes, polishing, etc. The dielectric layer 120 may include one or more of a number of conventional dielectric materials commonly utilized in the manufacture of microelectronic devices. Examples include, oxides (e.g. silicon dioxide, carbon doped dioxide), silicon nitride, and SiOCH. SiOCH is available under the tradename BDII or Black Diamond II® from Applied Materials, Inc., of Santa Clara, Calif. The dielectric material may be low-k or high-k and may include pores or other voids to reduce its dielectric constant. The thickness of the dielectric layer may also vary and may be, for example, in the range from about 140 nm (1400 Å) to about 300 nm (3000 Å). The substrate 110 may include known substrate types and materials that are typically used for semiconductor devices. The substrate may be p-type, n-type, neutral type, high or low resistivity, off-cut or not off-cut etc.

Conventional methods include forming a barrier layer (not shown) on the via/trench recess of the dielectric layer, prior to formation of the Cu-alloy layer. The barrier layer is typically formed from barrier material(s) that may include tantalum (Ta), tantalum nitride (TaN), titanium (Ti), titanium nitride (TiN), tungsten, cobalt, nickel, hafnium, niobium, zirconium, ruthenium, and alloys, nitrides, silicides, copier silicide and combinations thereof. The barrier layer may be formed from multiple layers of the barrier material, usually, through deposition techniques such as CVD or ALD or other known deposition techniques. The barrier layer in such applications is a continuous and conformal layer. In one or more embodiments, the thickness of the barrier layer may be constant or may vary. The barrier layer provides a buffer between the alloy layer and the dielectric material. Accordingly, the thickness of the barrier layer may be modified to prevent diffusion of the alloy layer into the dielectric layer or dielectric material.

The method of forming an interconnect material according to one or more embodiments according to the present invention, eliminates the need for a barrier layer or requires only a thin barrier layer, while preventing migration of the Cu atoms of the alloy layer. The method diffuses or segregates Mn from the bulk Cu portion of the Cu—Mn alloy layer to reduce the amount of Mn in the bulk Cu portion of the alloy layer. In other words, the method diffuses or segregates Mn to the outer surfaces of the alloy layer. Specifically, Mn is diffused or segregated from the bulk potion of the Cu alloy layer to the top surface or the surface adjacent to a second dielectric layer that can be deposited on the top surface of the Cu—Mn alloy layer. The diffused or segregated Mn and any MnO that is formed function as a barrier layer and thus eliminate the need for any additional barrier layers. Moreover, the diffusion or segregation of Mn also enhances the surface segregation of Mn, which facilitates the passivation of the alloy layer and providing an alloy layer with low resistivity.

In view of the potential elimination or minimization of a barrier layer, the methods described herein according to embodiments of the present invention may be referred to as an integration procedure in which BEOL interconnect material is formed and deposited in the via 130 and trench 135 recess by deposition of an alloy layer comprising Cu and Mn as an alloying element within the via 130 and the trench 135. Exemplary techniques of depositing the alloy layer 140 include physical vapor deposition (PVD), chemical vapor deposition (CVD) or atomic layer deposition (ALD). Alternative embodiments may utilize a plasma enhanced ALD process.

In one or more embodiments, deposition of the alloy layer 140 is typically followed by a copper electro-chemical plating process (ECP) or, alternatively, a deposition process to fill the trench and via with a desired metal. In other known methods, the desired metal may be pure Cu or may be another metal layer. According to one or more embodiments of the present invention, the metal includes a Cu—Mn alloy. Thereafter, the substrate may be subjected to chemical mechanical planarization (CMP) to remove excess interconnect fill metal to form the alloy layer. The planarization process may continue until the dielectric layer is reached so that only the walls of the trench 135 and the via 130 are covered with the interconnect fill metal. In embodiments which utilize a thin layer of a barrier layer, CMP may be utilized to remove excess barrier material. CMP may be modified to provide the desired height of the interconnection structure.

The resulting alloy layer 140 includes a bottom surface 142, a top surface 144 and a bulk or a bulk portion 143 between the bottom surface 142 and the top surface 144. The alloy layer 140 may have a thickness in the range from about 1000 Å to about 4000 Å. In one or more specific embodiments, the alloy layer may have a thickness of about 3000 Å. In one or more alternative embodiments, the thickness of the alloy layer 140 may be less than 1000 Å.

In one or more embodiments, the Cu—Mn alloy layer may have a concentration of Mn of about 2% atomic. In one or more embodiments, the concentration of Mn may be in the range from about 1% to about 3% atomic. In another variant, Mn may be present at a concentration in the range from about 1.8% to about 2.2% atomic.

In one or more embodiments of the present invention, the method further includes annealing the substrate 110 and the alloy layer 140 to drive the residue alloying element (Mn) to outer surfaces of the alloy layer, namely, the bottom surface 142 adjacent to the dielectric layer and the top surface 144 on the opposite end of the bottom layer. In other words, annealing reduces the concentration of Mn atoms in the bulk portion 143 of the Cu—Mn alloy layer 140.

Annealing may occur within an annealing chamber, which may include a preclean chamber, as will be discussed in greater detail below. In accordance with one or more embodiments, annealing is performed in an atomic hydrogen environment. In one or more embodiments, the substrate is annealed at a temperature in the range from about 70° C. to about 400° C. or, more specifically in the range from about 200° C. to about 400° C. The substrate may be annealed for a period of time in the range from about 0.5 minutes to about 10 minutes or, more specifically from about 0.5 minutes to about 5 minutes. In one or more specific embodiments, the substrate is annealed at a temperature of about 300° C. for about 5 minutes.

In one or more embodiments, the atomic hydrogen environment may be plasma generated. In other words, energized hydrogen atoms or hydrogen radicals are provided in a chamber during annealing. In one or more embodiments, the energized hydrogen atoms or hydrogen radicals are created within a plasma generation region that is present in the processing region of the chamber. In one or more alternative embodiments, the energized hydrogen atoms or hydrogen radicals are generated in a plasma generation region that is remote from the processing region of the chamber and is referred to herein as a "remote plasma source." The remote plasma source may be provided in fluid communication with the annealing chamber, as will be discussed in greater detail below.

Figure 3:
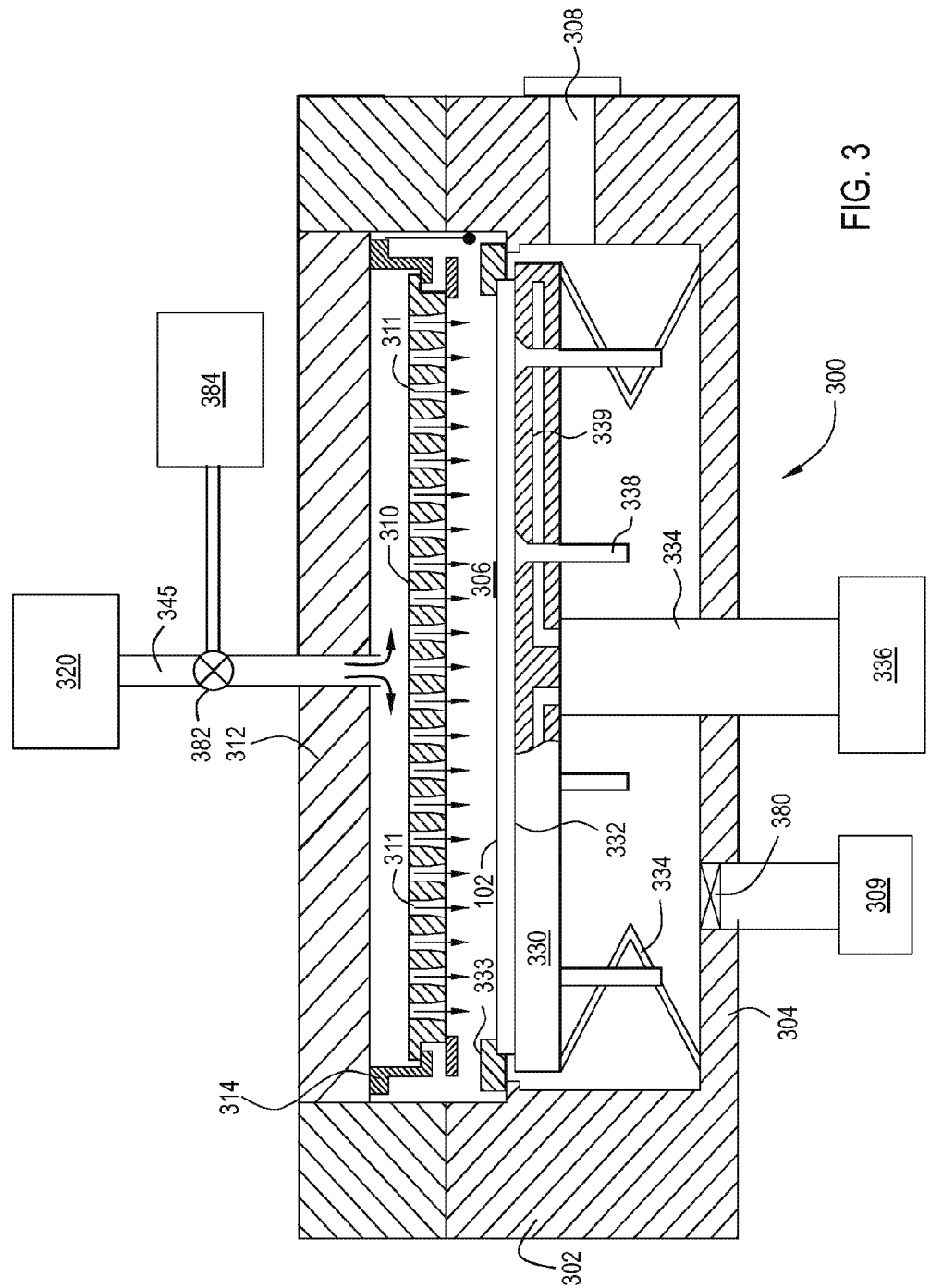
FIG. 3 is a schematic, cross-sectional view of a chamber for forming an interconnection according to one or more embodiments of the present invention.

FIG. 3 is a schematic, cross-sectional view of a processing chamber 300 utilized to form Cu—Mn alloy layer 140 on a substrate 110, in accordance with one or more of the methods described herein. Specifically, FIG. 3 illustrates a processing chamber 300 utilized for the formation of a Cu—Mn alloy layer in a dielectric layer 120. The dielectric layer 120 may be formed within processing chamber 300 or a different processing chamber.

The processing chamber 300 shown in FIG. 3 includes walls 302, a bottom 304, a showerhead 310 and a substrate support 330, which cumulatively define a processing region 306. The processing region 306 is accessed through a valve 308, such that a substrate 110 may be transferred into and out of the chamber 300. The substrate support 330 includes a substrate receiving surface 332 for supporting the substrate 110 and stem 334 coupled to a lift system 336 configured to raise and lower the substrate support 330. A shadow frame 333 may be optionally placed over a periphery of the substrate 110. Lift pins 338 are moveably disposed through the substrate support 330 to move the substrate 110 to and from the substrate receiving surface 332. The substrate support 330 may also include heating and/or cooling elements 339 to maintain the substrate support 330 at a desired temperature. A vacuum pump 309 is also coupled to the processing chamber 300 through a throttle valve 380 to control the processing region 306 at a desired pressure.

In the embodiment shown, the showerhead 310 is coupled to a backing plate 312 at its periphery by a suspension 314. The showerhead 310 may also be coupled to the backing plate by one or more center supports 316 to help prevent sag and/or control the straightness/curvature of the showerhead 310. A gas source 320 is configured to supply a processing gas through a gas conduit 345. The processing gas may include a silicon-containing gas, a Cu-containing gas and/or a Mn-containing gas or other suitable gas to form the dielectric layer 120 and/or the alloy layer 140. In one embodiment, the gas conduit 345 may be provided as an annular tube configured to feed the processing gas to the processing region 306 through a plurality of gas passages 311 in the showerhead 310.

Detailed embodiments of the invention may include at least one supplemental processing gas source 384 coupled to the processing region 306 of the processing chamber 300. The at least one supplemental processing gas source 384 can be coupled to the processing region 306 through the plurality of gas passages 311 in the showerhead 310. In specific embodiments, a proportioning valve 382 connects the supplemental processing gas source 384 to the copper and/or magnesium containing gas source 320. This proportioning valve 382 may be utilized to isolate and mix the gas source 320 and the at least one supplemental processing gas source 384 prior to introduction thereof into the processing region 306.

Prior to formation of the Cu—Mn alloy layer 140, the dielectric layer 120 is formed on the substrate 110 according to methods know in the art. In one or more embodiments, a Damascene structure 100 is formed in the dielectric layer 120 by forming at least one via 130 and one trench 135 in the dielectric layer using methods known in the art.

In one or more embodiments, formation of a Cu—Mn alloy layer 140 in the dielectric layer 120 includes introducing a Cu-containing gas and a Mn-containing gas into the processing region 306. In one or more embodiments, the Cu-containing gas may be provided as gas source 320 and the Mn-containing gas may be provided as supplemental processing gas source 384. The Cu-containing gas and the Mn-containing gas are introduced into the processing chamber 300 to form the alloy layer on the substrate. As described above, PVD, CVD, ALD techniques may be utilized to form the Cu—Mn alloy layer 140. In embodiments which utilize a plasma enhanced ALD technique to form the Cu—Mn alloy layer 140, the processing chamber 300 may include a RF power source to generate an electric field within the processing region 306.

Figure 4:
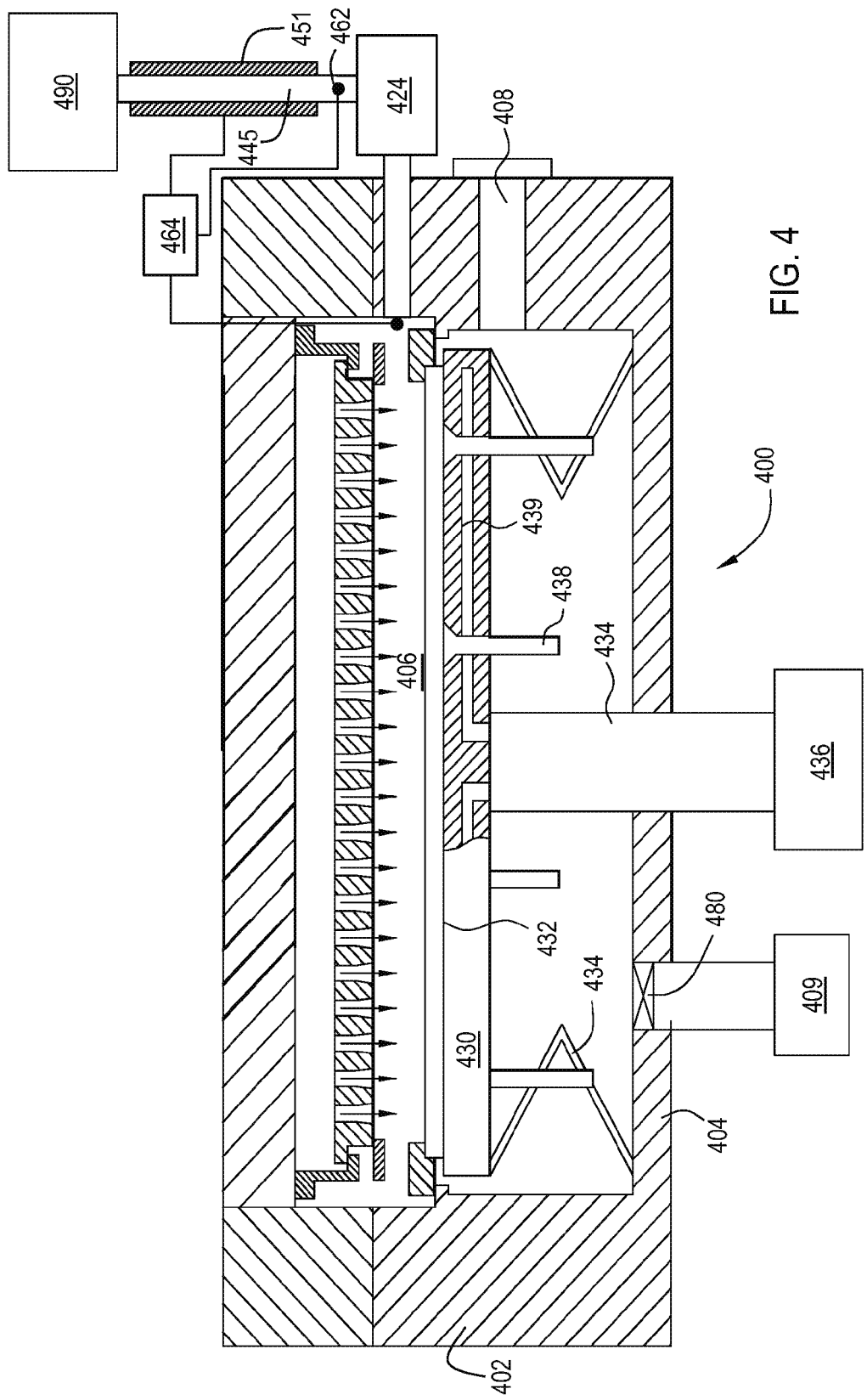
FIG. 4 is a schematic, cross-sectional view of an chamber utilized in one or more embodiments of the present invention.

In one embodiment, a substrate may be transported in and out of processing chamber 300 through valve 308 to an annealing chamber 400, as shown in FIG. 4. In one or more embodiments, the substrate may be transported within a cluster tool. Illustrative cluster tools include but are available under the trade names Producer, Centura, Endura, and Endura SL platforms, from Applied Materials, Inc., of Santa Clara, Calif.

In one or more embodiments, the annealing chamber 400 shown in FIG. 4 may be a preclean chamber. An example of a suitable preclean chamber is available under the trade name AKTIV PRECLEAN Chamber from Applied Materials, Inc. of Santa Clara, Calif. In the embodiment shown, the annealing chamber 400 includes a remote plasma source 424 in fluid communication with a gas conduit 445 for introducing hydrogen radicals into a processing region 406. The processing region 406 is accessed through a valve 408, such that a substrate 110 may be transferred into and out of the annealing chamber 400. The annealing chamber 400 also includes walls 402, a bottom 404, and a substrate support 430, a substrate receiving surface 432 for supporting the substrate and stem 434 coupled to a lift system 436 configured to raise and lower the substrate support 430. A shadow frame 433 may be optionally placed over a periphery of the substrate. Lift pins 438 are moveably disposed through the substrate support 430 to move the substrate 110 to and from the substrate receiving surface 432. The substrate support 430 may also include heating and/or cooling elements 439 to maintain the substrate support 430 at a desired temperature. A vacuum pump 409 is also coupled to the annealing chamber 400 through a throttle valve 480 to control the processing region 406 at a desired pressure.

A hydrogen gas source 490 is coupled to the remote plasma source 424. The remote plasma source 424 is suitable for generating hydrogen radicals in the hydrogen-containing gas or to create an atomic hydrogen environment within the processing region 406 of the annealing chamber 400. The remote plasma source 424 is shown downstream of a heater jacket 451, but can be located upstream of the heater jacket 451. Placing the remote plasma source 424 downstream of the heater ensures that the hydrogen-containing gas is hot prior to generating hydrogen radicals and introduction of said radicals to a processing region 406 of the annealing chamber 400. The embodiment shown in FIG. 4 has two temperature probes 462. One probe is located downstream of the heater jacket 451 and the second is inside the chamber 400, downstream of the remote plasma source 424. This configuration would allow for the measurement of the temperature of the hydrogen-containing gas before and after radical generation. The dual probe configuration shown is merely illustrative of an example temperature feedback circuit 464 and should not be taken as limiting the scope of the invention. In specific embodiments, a single temperature probe 462 is used downstream of the heater jacket 451 before the gas enters the remote plasma source 424.

In embodiments in which the hydrogen radicals are generated by a remote plasma source, they may be directly introduced into the processing region 406 of the annealing chamber 400 via a line of sight path to minimize the loss of energy by the hydrogen radicals prior to reaching the processing region 406. The line of sight path may include tubing formed from a non-reactive material, such as a dielectric or ceramic material. In some configurations, it is desirable to heat the tubing to reduce the possible transfer of energy to the tubing and prevent adsorption of the hydrogen radicals onto the surface of the tubing prior to introduction into the processing region.

During annealing, the hydrogen radicals are introduced in the annealing chamber 400 or, alternatively, an atomic hydrogen environment is generated in the annealing chamber 400. In the embodiment shown in FIG. 4, the hydrogen gas is energized in the remote plasma source before introduction into the annealing chamber 400. In one or more alternative embodiments, the annealing chamber 400 may include an RF the power source (not shown) that provide an RF power so that an electric field is created within the processing region 406 of the annealing chamber. The introduction of a hydrogen gas into an energized annealing chamber 400 creates an atomic hydrogen environment.

During annealing, the Mn atoms diffused or segregated at the dielectric layer-alloy layer interface react with the dielectric layer to form manganese silicate, manganese silicon nitride or other materials including manganese and silicon. The manganese silicate, manganese silicon nitride or other material formed from the reaction between the Mn atoms and the dielectric layer form a barrier against the diffusion of copper atoms out of the interconnect material into the dielectric layer 120. This barrier protects the dielectric layer from premature breakdown. In addition, the transistors attached to the interconnection are also protected from degradation from copper diffusion. The manganese silicate, manganese silicon nitride or other material formed from the reaction between Mn atoms and the dielectric layer also promote strong adhesion between the copper and the dielectric material, thus preserving the mechanical integrity of the devices during manufacture and use. The strong adhesion at the copper-manganese silicate and/or manganese silicon nitride interfaces also protect against failure by electromigration of copper atoms during use of the devices.

Embodiments of the present invention recognize that reducing the amount of Mn atoms in the bulk portion 143 of the Cu—Mn alloy layer reduces the resistivity of the Cu—Mn alloy layer. Accordingly, segregation or diffusion of Mn atoms from the bulk portion 143 of the Cu—Mn alloy layer according to one or more embodiments of the present invention addresses the issue of high resistivity by annealing the Cu—Mn alloy layer in an atomic hydrogen environment. In addition, conventional processes do not adequately control Mn diffusion into the desired interfaces to achieve a consistent performance. Annealing in an atomic hydrogen environment drives the residue alloying elements, for example Mn, to the top surface of the Cu—Mn alloy layer thus lowering the content of Mn in the Cu alloy layer. In one or more embodiments, Mn atoms may also be driven to the bottom surface of the Cu—Mn alloy layer. In addition, the methods according to one or more embodiments also control Mn diffusion into the desired interfaces such that the resulting alloy layer and resulting device achieve a consistent performance.

In one or more embodiments, the alloyed layer exhibits a resistivity that is substantially equivalent to a seed layer or layer comprising pure Cu. In one or more embodiments, the diffusion of the alloying element or Mn results in an alloy layer that exhibits a resistivity that is 60% or more less than the resistivity exhibited by the alloy layer before the alloying element was diffused. In one or more specific embodiments, the alloy layer exhibits a resistivity in the range from about 5 µΩ/cm to about 2 µΩ/cm. In one or more specific embodiments, the alloy layer exhibits a resistivity of less than about 3 µΩ/cm.

In one or more embodiments, the substrate may be formed as part of a microelectric device. Examples of such microelectric devices include photovoltaic cells and integrated circuits.

EXAMPLES

The following non-limiting examples shall serve to illustrate the various embodiments of the present invention. Three substrates having a dielectric layer disposed thereon as a blanket silicon oxide wafer were prepared in an identical manner.

Inventive Example A was formed by depositing a Cu—Mn alloy layer on the blanket silicon oxide wafer using an RFX Cu PVD chamber including a heated or heating pedestal. An example of an RFX Cu PVD chamber is available under the tradename EnCoRe™ II from Applied Materials, Inc. of Santa Clara, Calif. The Cu—Mn alloy layer was deposited at room temperature and at a chamber pressure of approximately 1 mTorr. The thickness of the Cu—Mn alloy layer of Inventive Example A was 3000 Å. The substrate of Inventive Example A was then annealed in a preclean chamber in the presence of atomic hydrogen. The atomic hydrogen was generated using a remote plasma source of about 3 kW RF power with a hydrogen gas flow rate of about 400 sccm. The hydrogen radicals were then introduced into the wafer processing chamber. The Cu—Mn alloy layer of Inventive Example A was annealed at a temperature of 300° C. while being treated for a period of time of 5 minutes with the atomic hydrogen.

Comparative Example B was formed by depositing a Cu—Mn alloy layer in the blanket silicon oxide wafer in the same manner as Inventive Example A. The resulting thickness of the Cu—Mn alloy layer of Comparative Example B was 1500 Å. The Cu—Mn alloy layer was then annealed in Ar gas at a temperature of 400° C. for a period time of 15 minutes.

Comparative Example C was formed by depositing a pure Cu layer on the blanket silicon oxide wafer in the same manner as Inventive Example A. The thickness of the Cu layer of Comparative Example C was 1500 Å. Comparative Example C was then annealed in Ar gas at a temperature of 400° C. for a period time of 15 minutes.

Figure 5:
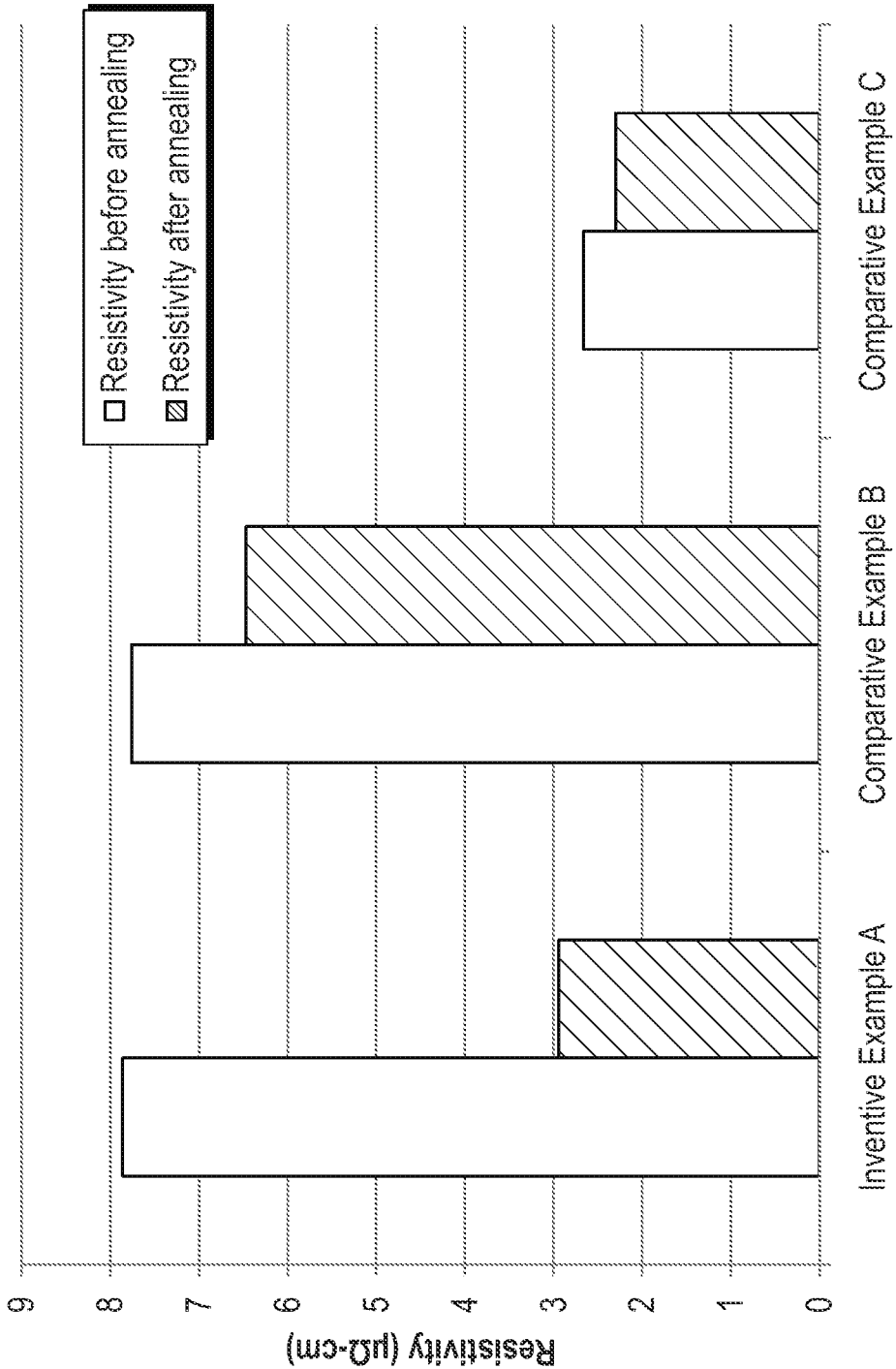
FIG. 5 illustrates the change in resistivity of a pure Cu layer and an Cu—Mn layer after annealing in an Ar atmosphere, according to the prior art, and a Cu—Mn layer after annealing in an atomic H atmosphere, according to one or more embodiments of the present invention.

Table 1 provides the respective resistance (Rs), thickness and resistivity of Inventive Example A and Comparative Examples B and C before and after annealing, as described above. These properties are also illustrated in FIG. 5.

TABLE 1

Properties of Inventive Example A and Comparative Examples B and C.

| Example | Condition | Rs (Ω) | Thickness (Å) | Resistivity (µΩ · cm) |
|---|---|---|---|---|
| Inventive Example A | Before annealing | 0.262 | 3000 | 7.86 |
| | After annealing in an atomic hydrogen environment | 0.098 | 3000 | 2.94 |
| Comparative Example B | Before annealing | 0.517 | 1500 | 7.76 |
| | After annealing in Ar | 0.413 | 1500 | 6.47 |
| Comparative Example C | Before annealing | 0.177 | 1500 | 2.66 |
| | After annealing in Ar | 0.153 | 1500 | 2.30 |

FIG. 5 illustrates the change in resistivity of the layers of Inventive Example A and Comparative Examples B and C. The change in resistivity of the Cu—Mn alloy layers of Inventive Example A and Comparative example B differs due to the environment in which annealing is performed. Specifically, the resistivity of the Cu—Mn alloy layer of Inventive Example A is reduced by more than 60%, when compared to the 20% reduction in resistivity of the Cu—Mn alloy layer of Comparative Example B. This substantial reduction comes in spite of Inventive Example A's initial as-deposited resistivity of over 7 μΩ/cm.

As shown in Table 1 and FIG. 5, the resistivity of the Cu—Mn alloy layer of Inventive Example 1 approaches or is close to the resistivity of the pure Cu layer of Comparative Example C. However, as has been noted in this application, it is believed that the use of pure Cu can lead to electromigration of Cu atoms into the dielectric layer, damaging the device and/or the performance thereof. The change in resistivity illustrated in FIG. 5 indicates that annealing in an atomic hydrogen environment provides an effective way to reduce the residue resistivity of Cu alloy layers, such as Cu—Mn alloy layers, and increases the feasibility of the use of alloy materials even when the as-deposited resistivity is high.

Figure 6:
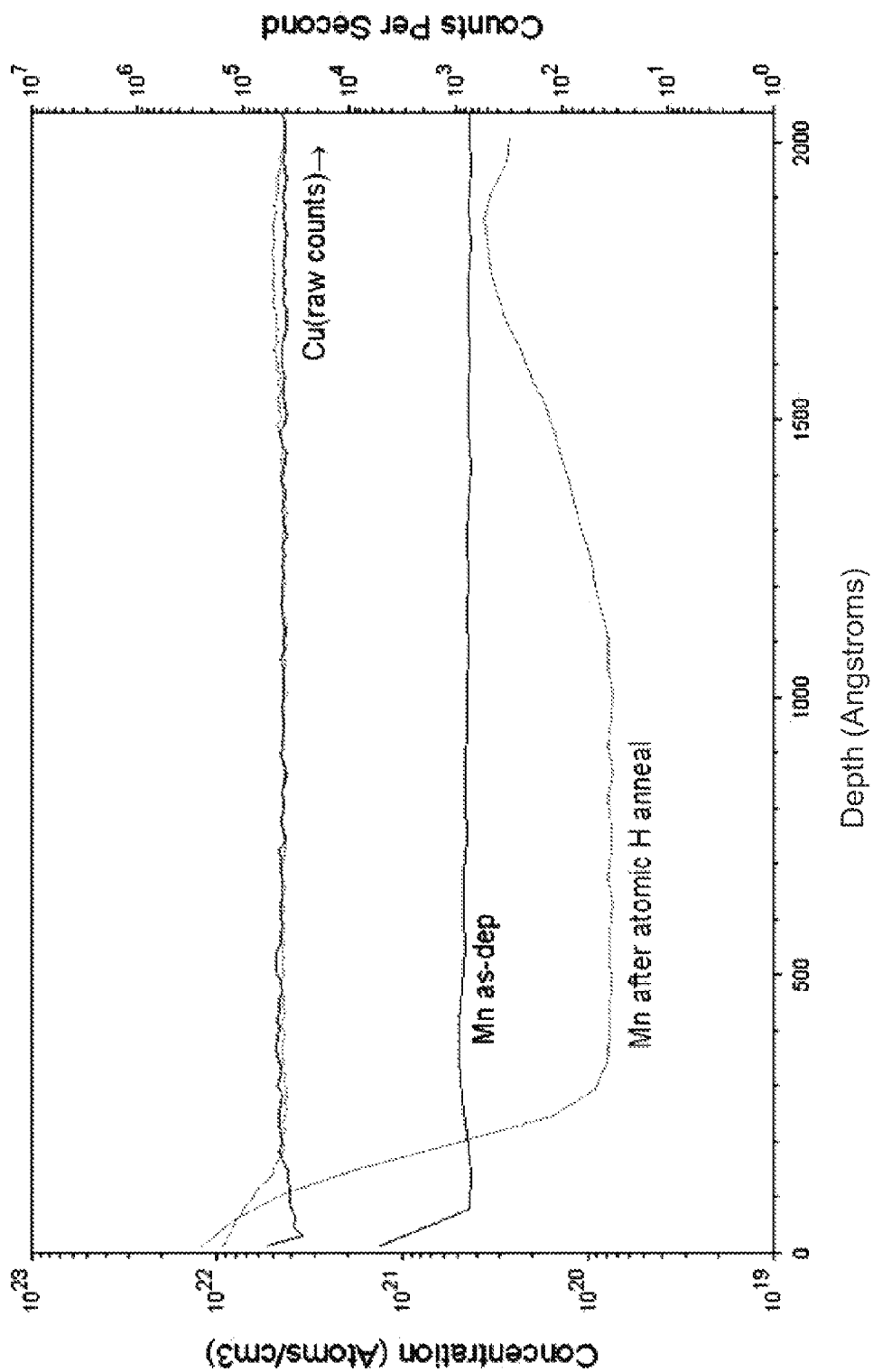
FIG. 6 illustrates an SIMS depth profile of the Cu—Mn layer shown in FIG. 2 after annealing in an atomic hydrogen environment.

FIG. 6 illustrates the depth profile of the Mn atom distribution in the Cu—Mn alloy layer of Inventive Example A. The depth profile was obtained using SIMS analysis of the Cu—Mn alloy layer of Inventive Example A before and after annealing in an atomic hydrogen environment, as described above.

Figure 2:
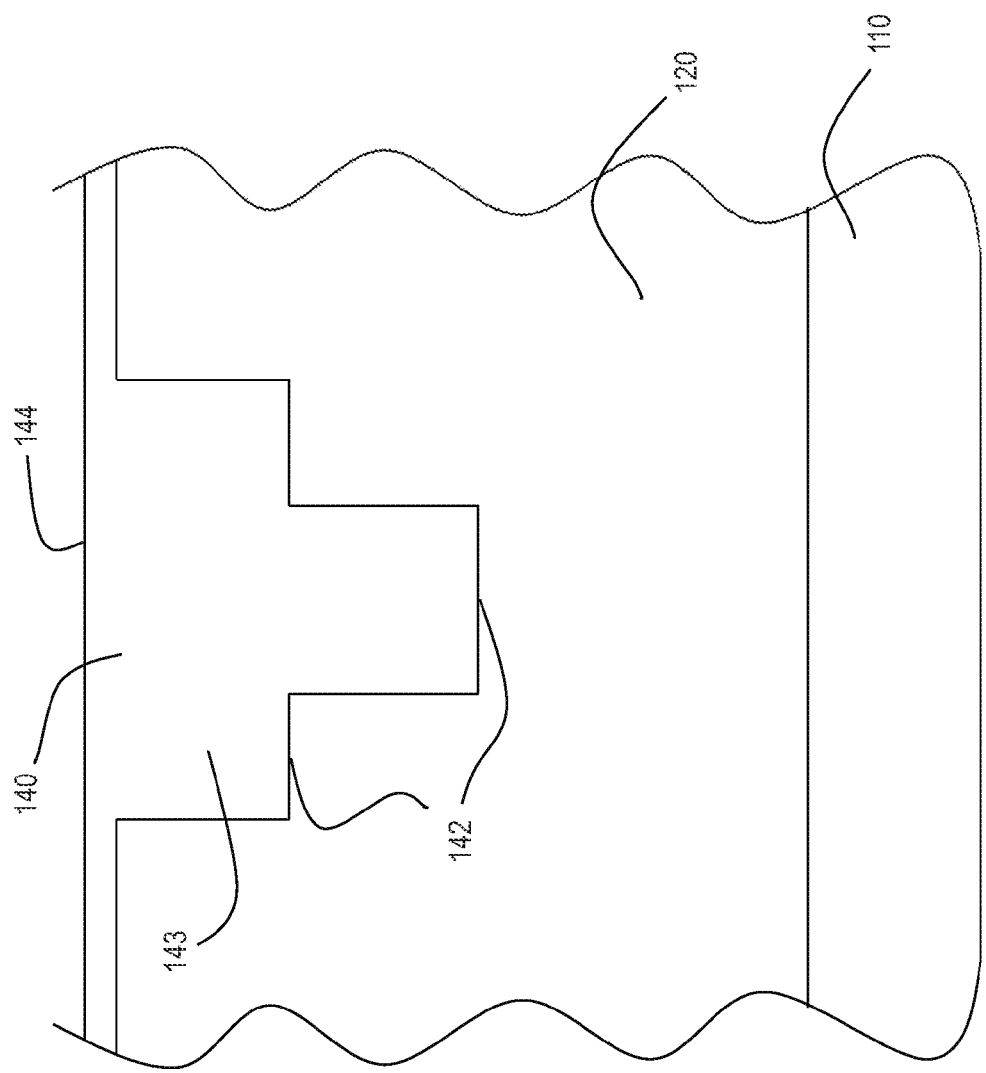
FIG. 2 illustrates an interconnection formed within the via and the trench recess shown in FIG. 1.

As shown in FIG. 6, the Mn atoms in Inventive Example A were driven to the top surface in contact with the atomic hydrogen flux. After annealing in an atomic hydrogen environment, the Mn content at the top layer of the layer increased by one and one-half times or by an order of magnitude of one and one-half. The top layer of the Cu—Mn alloy layer is exposed to air and will be adjacent to a second or additional dielectric layer that will be deposited on the Cu—Mn alloy layer. The Mn concentration at the bottom layer of the Cu—Mn alloy layer, which is opposite from the top layer, also increased. The Mn concentration in bulk portion 143 or bulk Cu portion of the Cu—Mn alloy layer is reduced to only one-tenth of the original concentration of Mn in the bulk portion 143 or bulk Cu portion of the Cu—Mn alloy layer, illustrated in FIG. 2. The segregation of Mn after hydrogen anneal is usefully to reduce resistivity of Cu metal lines and to control the desired Mn distribution for improving the electrical performance. Improvement in electrical performance that results from segregation of Mn from the bulk portion 143 (as shown in FIG. 2) or bulk Cu portion of the Cu—Mn alloy layer may include reduced electromigration.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method for forming interconnections in a microelectronic device comprising:
   providing a substrate comprising a dielectric layer disposed thereon, which comprises one or more recesses;
   depositing an alloy layer comprising Cu and an alloying element that fills the one or more recesses in the dielectric layer, the alloy layer comprising a bottom surface in contact with the dielectric layer, a top surface and a bulk between the bottom surface and the top surface; and
   annealing the substrate in an atomic hydrogen environment under conditions to diffuse the alloying element toward the bottom surface and the top surface, the alloyed layer exhibiting a resistivity of substantially equivalent to a layer comprising pure Cu.

2. The method of claim 1, wherein, after diffusing the alloying element toward the top surface and bottom surface, the alloy layer exhibits a resistivity 60% less than the resistivity exhibited by the alloy layer before diffusing the alloying element.

3. The method of claim 1, wherein the alloying element comprises Mn, Mg, Ta, Zr and combinations thereof.

4. The method of claim 1, further comprising generating the atomic hydrogen environment in a plasma source.

5. The method of claim 4, wherein annealing the substrate includes introducing a hydrogen gas into a reaction chamber.

6. The method of claim 5, further comprising energizing the hydrogen gas in a remote plasma chamber in fluid communication with the reaction chamber.

7. The method of claim 6, wherein energizing the hydrogen gas comprises introducing the hydrogen gas in the remote plasma chamber and energizing the hydrogen gas.

8. The method of claim 7, wherein the substrate is annealed at a temperature in the range from about 200° C. to about 400° C. for a period of time in the range from about 0.5 minutes to about 5 minutes.

9. A method for forming a copper interconnection on a substrate comprising:
   disposing the substrate in a reaction chamber;
   depositing a dielectric layer on the substrate in the reaction chamber;
   forming at least one trench and via in the dielectric layer;
   depositing an alloy layer comprising Cu and an Mn alloying element that fills the at least one trench and via in the dielectric layer, the alloy layer comprising a bottom surface in contact with the dielectric layer, a top surface and a bulk between the bottom surface and the top surface; and
   annealing the substrate in an atomic hydrogen environment to segregate the Mn alloying element from the Cu.

10. The method of claim 9, wherein segregating the Mn alloying element comprises diffusing the Mn alloying element from the bulk portion of the alloy layer toward the top surface and the bottom surface of the alloy layer.

11. The method of claim 10, wherein the alloy layer exhibits a resistivity of in the range from about 5 μΩ/cm to about 2 μΩ/cm.

12. The method of claim 11, wherein the alloy layer exhibits a resistivity of about 2 μΩ/cm to about 3 μΩ/cm.

13. The method of claim 11, wherein annealing occurs at a temperature in the range from about 200° C. to about 400° C. for a period of time in the range from about 0.5 minutes to about 5 minutes.

14. A method for preventing electromigration of copper in microelectronic devices, the method comprising:
  depositing a dielectric layer on a substrate;
  forming at least one copper interconnection structure in the dielectric layer, the copper interconnection structure consisting essentially of a Cu—Mn alloy; and
  annealing the copper interconnection structure in an atomic hydrogen environment.

15. The method of claim 14, wherein the copper interconnection structure comprises a top surface, a bottom surface in contact with the dielectric layer and a bulk between the top surface and the bottom surface, the top surface and the bottom surface comprising a higher concentration of Mn atoms than the bulk.

16. The method of claim 15, wherein forming at least one copper interconnection structure in the dielectric layer comprises forming a trench and a via in the dielectric layer and depositing a copper and manganese alloy layer in the trench and the via.

17. The method of claim 16, wherein forming at least one copper interconnection structure comprises depositing the copper and manganese alloy layer by copper electrochemical plating.

18. The method of claim 17, further comprising planarizing the copper and manganese alloy layer by chemical mechanical planarization prior to annealing the copper interconnection structure.

* * * * *